(12) United States Patent
deBlanc et al.

(10) Patent No.: US 6,938,331 B2
(45) Date of Patent: Sep. 6, 2005

(54) METHOD FOR FABRICATING A FILAMENT AFFIXED TRACE WITHIN AN ELECTRONIC DEVICE

(75) Inventors: James J. deBlanc, Roseville, CA (US); David Dickey, Roseville, CA (US); Andrew Michael Cherniski, Rescue, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/703,122

(22) Filed: Nov. 6, 2003

(65) Prior Publication Data

US 2004/0163245 A1 Aug. 26, 2004

Related U.S. Application Data

(62) Division of application No. 09/870,839, filed on May 31, 2001, now Pat. No. 6,696,906.

(51) Int. Cl.[7] .............................................. H01R 43/00
(52) U.S. Cl. ............................ 29/825; 29/829; 29/830; 29/831; 29/835; 29/846; 29/847; 333/238
(58) Field of Search ........................... 29/847, 846, 830, 29/832, 831, 825, 600, 601, 602.1; 333/238, 246, 244; 174/117 AS (56) References Cited

U.S. PATENT DOCUMENTS

| 4,365,222 A | * | 12/1982 | Lampert ...................... 333/238 |
| 5,072,201 A | * | 12/1991 | Devaux et al. ............. 333/238 |
| 6,317,023 B1 | * | 11/2001 | Felten ......................... 338/254 |
| 6,696,906 B1 | * | 2/2004 | deBlanc et al. ............. 333/238 |
| 2001/0015684 A1 | * | 8/2001 | Kim et al. ................... 333/238 |
| 2004/0163245 A1 | * | 8/2004 | deBlanc et al. ................ 29/847 |

* cited by examiner

*Primary Examiner*—Minh Trinh (57) ABSTRACT

A method for fabricating a filament-affixed trace within an electronic device, such as a circuit board or microelectronic device. Conductive traces are affixed to the surface of a composite substrate containing filaments in a matrix bonded to an underlying solid material. The matrix is then removed, leaving the conductive traces suspended or supported by filaments. The signal intensity attenuation for filament-suspended or filament-supported signal lines is much lower than signal lines embedded in solid dielectric materials, allowing for transmission of significantly higher frequency signals within filament-suspended and filament-supported signal lines.

10 Claims, 6 Drawing Sheets

METHOD FOR FABRICATING A FILAMENT AFFIXED TRACE WITHIN AN ELECTRONIC DEVICE

CROSS REFERENCE

This application is a divisional application of application Ser. No. 09/870,839, filed May 30, 2001, now U.S. Pat. No. 6,696,906.

TECHNICAL FIELD

The present invention is related to fabrication of circuit boards and microelectronic devices containing signal lines embedded in dielectric substrates and, in particular, to circuit boards and microelectronic devices in which dielectric material surrounding striplines is eliminated, effectively substituting air for the dielectric material, in order to greatly decrease the dielectric loss coefficient for the stripline.

BACKGROUND OF THE INVENTION

In circuit boards and in various microelectronic devices, numerous signals paths electrically interconnect electrical components and subcomponents affixed to, or incorporated within, the circuit boards and microelectronic devices. In many cases, these signal lines, also called "striplines" and "traces," are composed of copper, or another conductive element or alloy, embedded within a dielectric substrate, such as a fiberglass and epoxy composite or a plastic material. In general, the signals transmitted through signal lines represent information as discrete voltage pulses, with a relatively low voltage state representing a first binary value and a relatively high voltage state representing a second binary value. When the rise/fall time of the signal within the signal line is fast enough that the signal line can change from one logic state to another in less time than it takes for the signal to traverse the length of the signal line, then the signal line is typically mathematically modeled as a transmission line. In a transmission line, the strength, or intensity, of the signal is attenuated as the signal traverses the signal line. The attenuation of the signal α is modeled as the sum of two attenuation coefficients:

$$\alpha = \alpha_C + \alpha_D$$

where $\alpha_C$=attenuation coefficient for conduction, and
$\alpha_D$=attenuation coefficient for dielectric loss
The attenuation coefficient α is normally expressed in dimensions of decibels/meter ("dB/m"). The attenuation coefficient $\alpha_C$ arises from resistance of the conductive element or alloy from which the signal line is composed, and the attenuation coefficient $\alpha_D$ arises from dissipation of energy within the dielectric substrate surrounding the signal line. This dissipation of energy occurs as molecules within the dielectric substrate, having either permanent or induced electric dipole moments, realign themselves within the fluctuating electric field produced by the electric signal transmitted through the signal line. The attenuation coefficient $\alpha_D$ is proportional to the frequency of the signal, as shown by:

$$\alpha_D \propto \frac{\pi \sqrt{\varepsilon_r}\, f \tan \delta}{C}$$

where $\varepsilon_r$ is the relative permittivity,
tan δ is the loss tangent,
f is signal frequency, and
C is speed of light The relative permittivity and the loss tangent are characteristic for each different dielectric material. The relative permittivities and loss tangents for a number of materials are provided below, in Table 1:

TABLE 1

| Substrate Material | Relative Permittivity $\varepsilon_r$ | Loss tangent tan δ |
|---|---|---|
| Alumina 99.5% Pure | 9.8 | 0.0001 |
| FR4 Fiberglass | 4.5–4.9 | 0.01 |
| GaAs | 12.9 | 0.002 |
| PTFE | 2.1 | 0.0003 |
| Quartz | 3.78 | 0.0001 |
| Polyethylene | 2.2 | 0.0002 |
| Dry Air | 1.0006 | $1 \times 10^{-9}$ |
| Vacuum | 1 | 0 |

Figure 1:
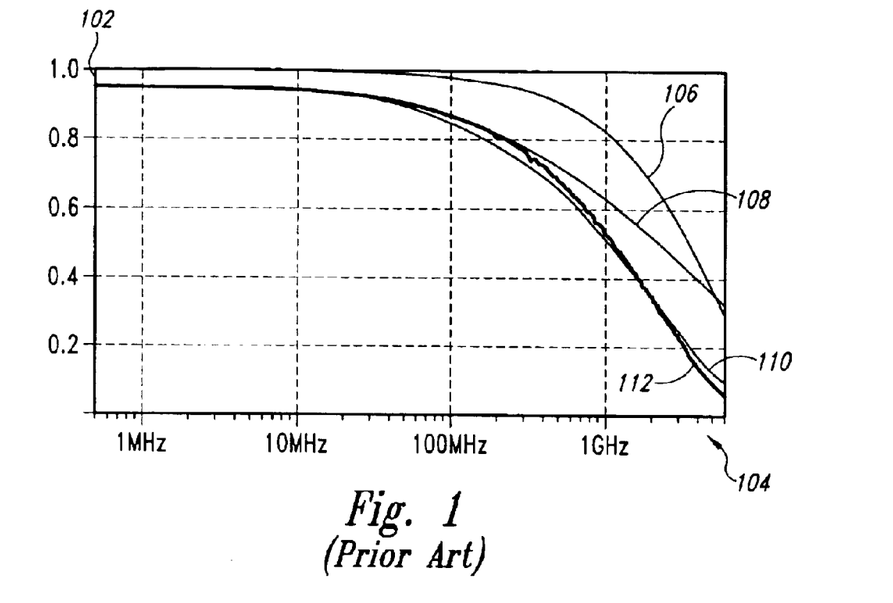
FIG. 1 shows a graph of the attenuation of signal intensity per unit length versus signal frequency.

FIG. 1 shows a graph of the attenuation of signal intensity per unit length versus signal frequency. In FIG. 1, the vertical axis 102 represents the relative signal intensity following transmission of the signal through a unit length of signal line, and the horizontal axis 104 represents the logarithm of the signal frequency. Curve 106 represents theoretical signal intensity attenuation due to dielectric loss, or $\alpha_D$, and curve 108 represents signal attenuation due to resistivity of the conductive element or alloy from which the signal line is composed. Curve 110 is the calculated overall signal attenuation, and curve 112 is an experimentally measured signal attenuation. Note the steep increase in signal attenuation in the gigahertz signal frequency range.

Figure 2:
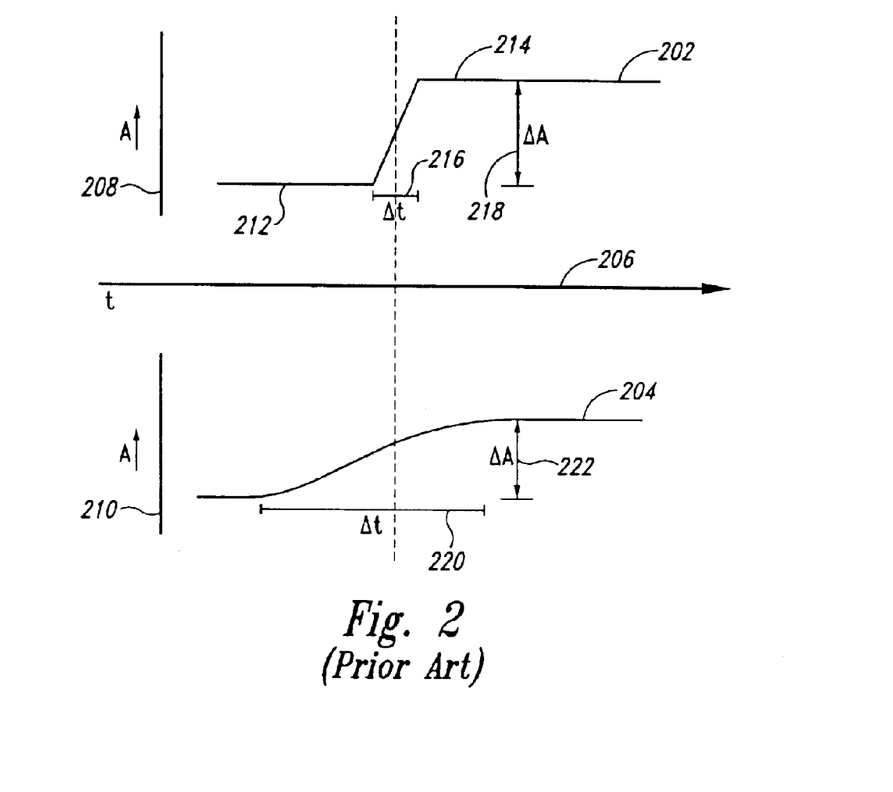
FIG. 2 illustrate the effects of frequency-dependent attenuation of signal strength within a signal line on the signal transmitted within the signal line.

FIG. 2 illustrates the effects of frequency-dependent attenuation of signal strength within a signal line on the signal transmitted within the signal line. FIG. 2 shows a desirable low-state-to-high-state signal transition 202 and a low-state-to-high-state signal transition 204 when significant signal intensity attenuation occurs due to resistivity of the conducting element or alloy and to dielectric loss. Both low-state-to-high-state transitions are plotted in time against a common time axis 206 and against separate amplitude axes 208 and 210. For the desirable transition 202, the signal rises from a low state 212 to a high state 214 within a relatively short period of time Δt 216. For the desirable transition, the rise Δα 218 corresponds to the amplitude or voltage differential generated at the source of the signal. However, when signal attenuation occurs, as described above, the transition time Δt 220 may increase and the amplitude or voltage differential 222 may decrease. This lower final amplitude is due to conduction losses.

Signal intensity attenuation within a signal line may lead to inoperability of an electronic circuit containing the signal line. Attenuation of the signal intensity may prevent the signal from rising above a voltage or amplitude differential threshold required for signal detection by the destination component or subcomponent connected to the signal line. Increase in the time of transition between low and high voltage or amplitude states may prevent transmission of the signal altogether. As discussed above, with reference to FIG. 1, the degradation of transition times and signal intensity is frequency dependent, and greatly increases in the gigahertz range. However, modern microprocessors are currently operated at frequencies in the gigahertz range, and are continuously being enhanced to operate at faster speeds. Transmission of signals between microprocessors and other electronic components within circuit boards and microelectronic devices has become a serious bottleneck constraining overall circuit-board and microelectronic-device processing throughput and speed of operation.

Figure 3:
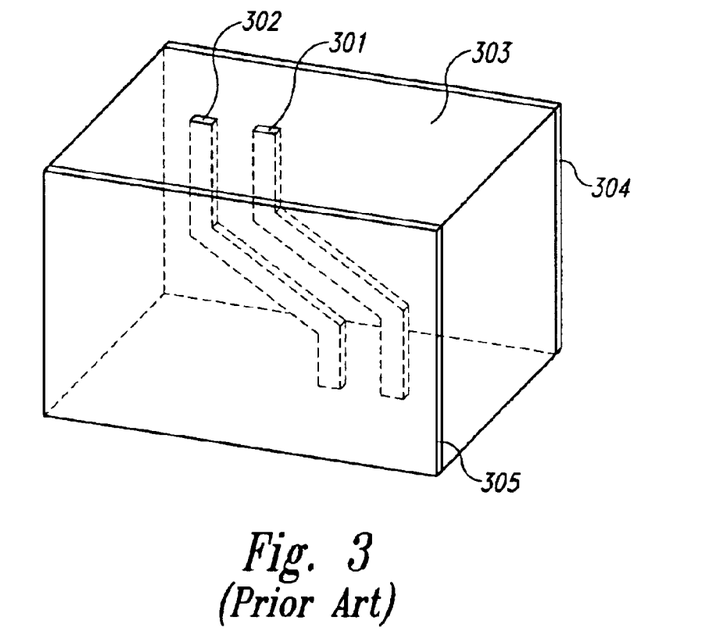
FIG. 3 shows a small section of a circuit board or microelectronic device including two embedded signal lines.

FIG. 3 shows a small section of a circuit board or microelectronic device including two embedded signal lines. In this portion of a circuit board or microelectronic device, the two conductive signal lines 301 and 302, also called "striplines," or "traces," are embedded in a dielectric material 303 parallel to two conductive planes 304 and 305. The conductive planes 304 and 305 serve as electrical reference planes, or ground planes, for the signal lines 301 and 302. According to the above discussion, for the traces 301 and 302 to support signal transmission, the signal intensity attenuation must be maintained below a threshold value that depends on the signal response characteristics of subcomponents interconnected by the signal lines and by required times for signal state transitions. As discussed above, signal intensity attenuation is frequency dependent, so as the frequencies of signals carried by the signal lines increases with increasing microprocessor speed, circuit board and microelectronic device designers must more and more carefully control design and material parameters in order to maintain signal intensity attenuation below necessary threshold values.

Currently, circuit board and microelectronic device designers maintain signal intensity attenuation below threshold values by either minimizing the length of signal lines, choosing materials for signal lines having low resistivities, or by choosing dielectric substrate material with low relative permittivities and, most particularly, with low loss tangents. Unfortunately, substrate materials generally increase in cost with decreasing loss tangents. For example, polytetrafluoroethylene ("PTFE") has a loss tangent several orders of magnitude below that of FR4 fiberglass, but is far more expensive as a bulk material, and may additionally increase manufacturing costs due to changes in manufacturing procedures required for PTFE-based fabrication. Designers and manufacturers of circuit boards and microelectronic devices generally attempt to minimize signal line length for many reasons in addition to minimizing signal intensity attenuation, and signal line length minimization is constrained by component subcomponent sizes, heat dissipation requirements, internal electrical field and radio frequency interference, device geometries, and other such factors. Therefore, designers and manufacturers of circuit boards and other microelectronic devices employing conductive traces have recognized the need for identifying and employing new, inexpensive dielectric substrate materials with significantly lower loss tangents in order to maintain signal intensity attenuation below acceptable threshold values.

SUMMARY OF THE INVENTION

One embodiment of the present invention involves substitution of air for common dielectric substrates in which striplines of circuit boards and microelectronic devices are embedded. Air has an extremely low loss tangent, which, in turn, greatly decreases the attenuation coefficient $\alpha_D$ for traces surrounded by air relative to traces surrounded by solid dielectric substrate materials. The traces are initially embedded within a filament-containing substrate material during manufacture. A matrix portion of the substrate material is then removed by melting, sublimation, chemical dissolution, or other removal technique to leave the traces suspended between conductive reference planes by the filaments. The conductive reference planes are maintained in rigid, parallel displacement from one another by any of various support or framing structures to which the conductive reference planes are affixed or mounted prior to removal of the matrix portion of the filament-containing substrate.

DETAILED DESCRIPTION OF THE INVENTION

One embodiment of the present invention consists essentially of replacing common dielectric substrates in which conductive traces are embedded within multi-layer circuit boards and other microelectronic devices with air. As shown in Table 1, above, dry air has an extremely low loss tangent and relative permittivity with respect to the other various solid substances listed in Table 1. Dry air is a close approximation, with respect to attenuation coefficient $\alpha_D$, to the vacuum, which has an attenuation coefficient $\alpha_D$ of zero. The inventors realized that if common solid dielectric substrates can be economically replaced with air within multi-layer circuit boards and other microelectronic devices, the usable signal frequency range within traces incorporated into those circuit boards and microelectronic devices can be greatly expanded while maintaining signal intensity attenuation below required threshold values.

Figure 4:
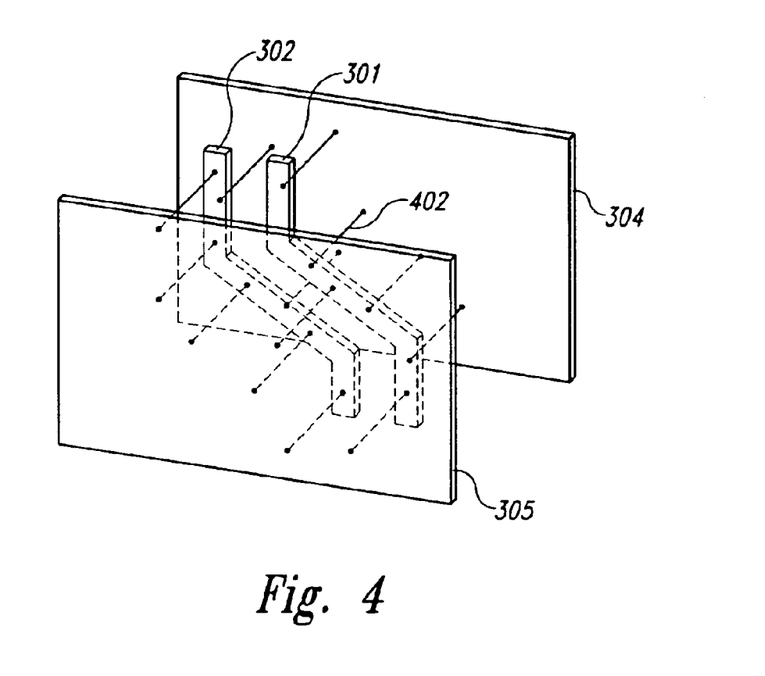
FIG. 4 illustrates the present invention employed within a portion of a circuit board or microelectronic device equivalent to that shown in FIG. 3.

FIG. 4 illustrates the present invention employed within a portion of a circuit board or microelectronic device equivalent to that shown in FIG. 3. As in FIG. 3, two traces 301 and 302 are located equidistant from two conductive reference planes 304 and 305. However, unlike in FIG. 3, there is no solid dielectric material between the conductive reference planes 304 and 305 surrounding the traces 301 and 302. Instead, the traces are suspended in air between the two conductive planes 304 and 305 by a number of filaments, such as filament 402. The filaments are attached, on one end, to a reference conductive plane and are attached, on the opposite end, to the surface of a trace. The two conductive reference planes 304 and 305 are held in a fixed, parallel displacement from one another by other structural members within the circuit board or microelectronic device not shown in the small section illustrated in FIG. 4. In an alternative embodiment, the filaments may interconnect a trace with a conductive reference plane via a complex, self-supporting network of filaments in which a given single filament may not directly connect to either the trace or the conductive reference plane. In another alternative embodiment, the filaments may suspend a trace between features or components of a circuit board or microelectronic device other than conductive reference planes.

FIGS. 5–11 illustrate two alternative manufacturing techniques for fabricating traces suspended in air by filaments between conductive reference planes, illustrated in FIG. 4. As with FIGS. 3 and 4, FIGS. 5–11 illustrate a small portion of a circuit board or microelectronic device during the manufacturing processes. A small portion is illustrated in these figures in order to clearly depict the manufacturing steps related to the present invention without adding unnecessary complexity that would be introduced by attempting to illustrate an entire circuit board or microelectronic device.

Figure 5:
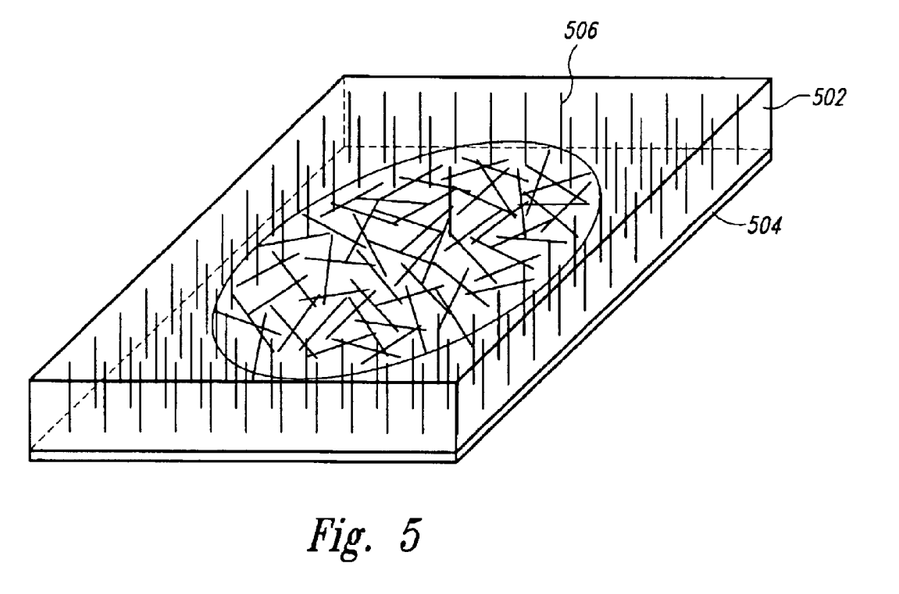
FIG. 5 shows a starting material for manufacturing filament-suspended traces within circuit boards and microelectronic devices.

FIG. 5 shows a starting material for manufacturing filament-suspended traces within circuit boards and microelectronic devices. The initial material includes a filament-containing dielectric substrate 502 laminated to an underlying conductive plane 504. The filament-containing substrate 502 contains numerous resilient filaments, such as resilient filament 506. The filaments may be oriented, in the example shown in FIG. 5, perpendicular to the underlying conductive plane 504. In alternative filament-containing substrates, the filaments may have different or random orientations. The ultimate mechanical strength of suspended traces depends on the density of filaments within the filament-containing substrate, on the rigidity and resilience of the filaments, and on other such properties and characteristics of the filament material. The density, orientation, and composition of the filaments may be selected to achieve suitable mechanical properties in the resulting suspended traces. One important property of the filament-containing substrate is that the matrix, or non-filament portion of the filament-containing substrate, needs to differ in a physical or chemical property from the filaments sufficiently to be removed from the circuit board or microelectronic device containing the substrate by a physical or chemical process. For example, the substrate may have a lower melting point than the filaments, and may therefore be removed by raising the filament-containing substrate to an appropriate temperature above the matrix melting point. Similarly, the substrate matrix may readily dissolve in a particular solvent in which the filament is insoluble, and the matrix material may be removed by exposing the filament-containing substrate to the solvent. Various polymeric materials may be employed for filaments, including carbon fibers, aramid fibers, inorganic polymers, biopolymers, and stretched or extruded glasses. The matrix may be composed of a wide variety of solid materials, including open and closed cell rigid foams, plastics, and inorganic materials.

Figure 6:
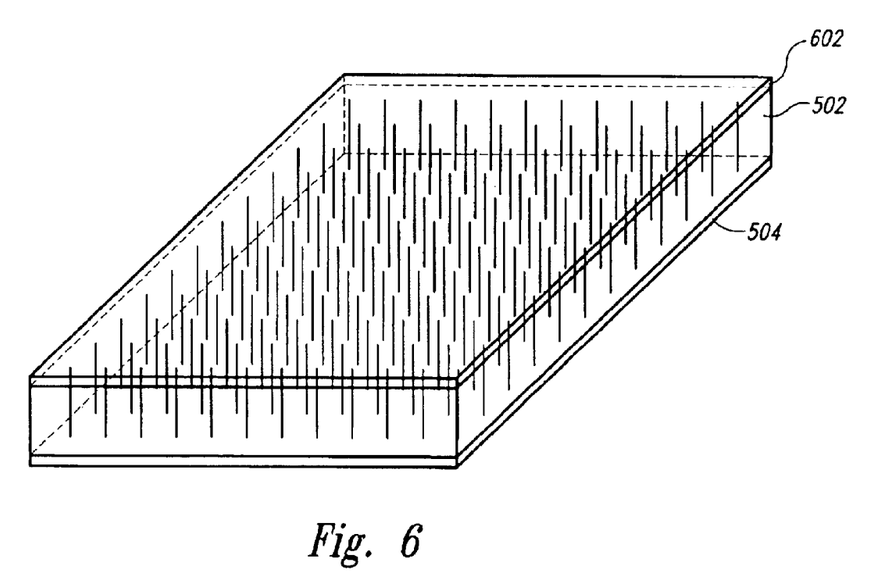
FIG. 6 shows a second step of a first filament-suspended trace manufacturing process.

FIG. 6 shows a second step of a first filament-suspended trace manufacturing process. In FIG. 6, a second conductive plane 602 has been affixed to the surface of the filament-containing substrate 502. This second conductive plane 602 may be laminated, glued, or deposited on the surface of the filament-containing substrate in such a way that the ends of the filaments exposed on the surface of the filament-containing substrate bond or adhere to the second conducting plane 602. In one embodiment, both the underlying conductive plane 504 and the second conductive plane 602 are thin layers of copper. In certain cases, the surface of the filament-containing substrate may need to be planarized or chemically treated to provide a sufficiently flat surface for binding and to expose the ends of a sufficient number of filaments.

Figure 7:
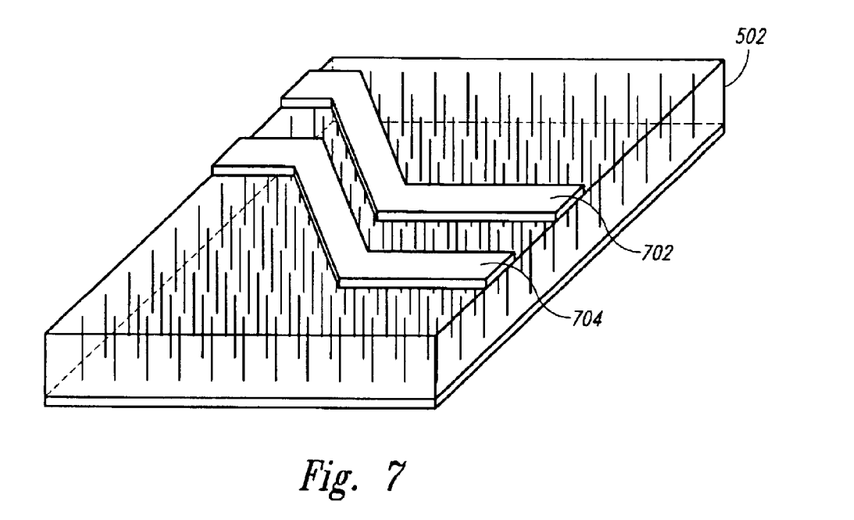
FIG. 7 shows a third step of a first method for fabricating filament-suspended traces.

FIG. 7 shows a third step of a first method for fabricating filament-suspended traces. The second conductive plane (602 in FIG. 6) is overlaid with photoresist that is masked and etched by standard photolithographic techniques. These techniques leave either a positive or negative photoresist mask outlining the traces. The unmasked portions of the second conductive plane are then etched away by standard photolithographic etching processes to leave traces 702 and 704 bonded to the surface of the filament-containing dielectric substrate 502.

Figure 8:
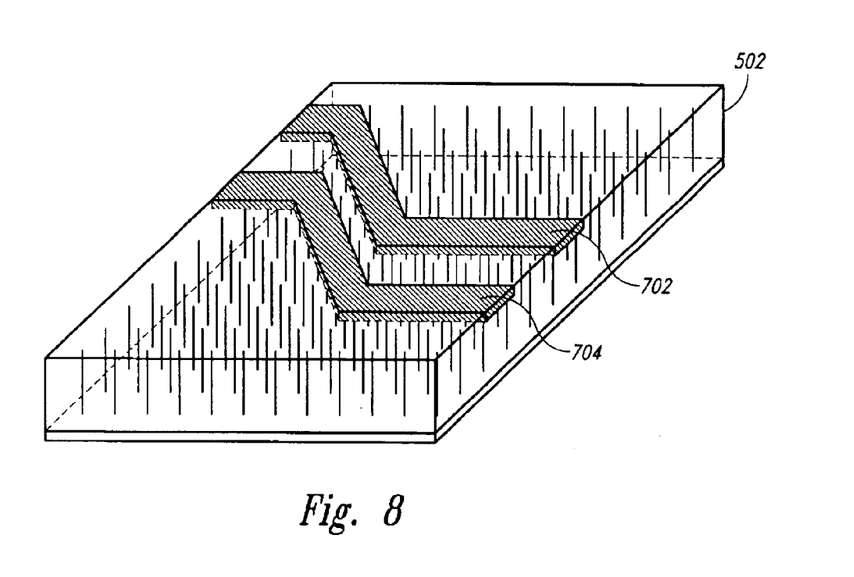
FIG. 8 shows a third step in a first alternative manufacturing process for filament-suspended traces.

FIG. 8 shows a third step in a first manufacturing process for filament-suspended traces. In FIG. 8, additional substrate matrix material has been added to the surface of the filament-containing dielectric matrix 502, and the surface has then been planarized so that the top surfaces of the conductive traces 702 and 704 are exposed and coplanar with the surface of the substrate.

Figure 9:
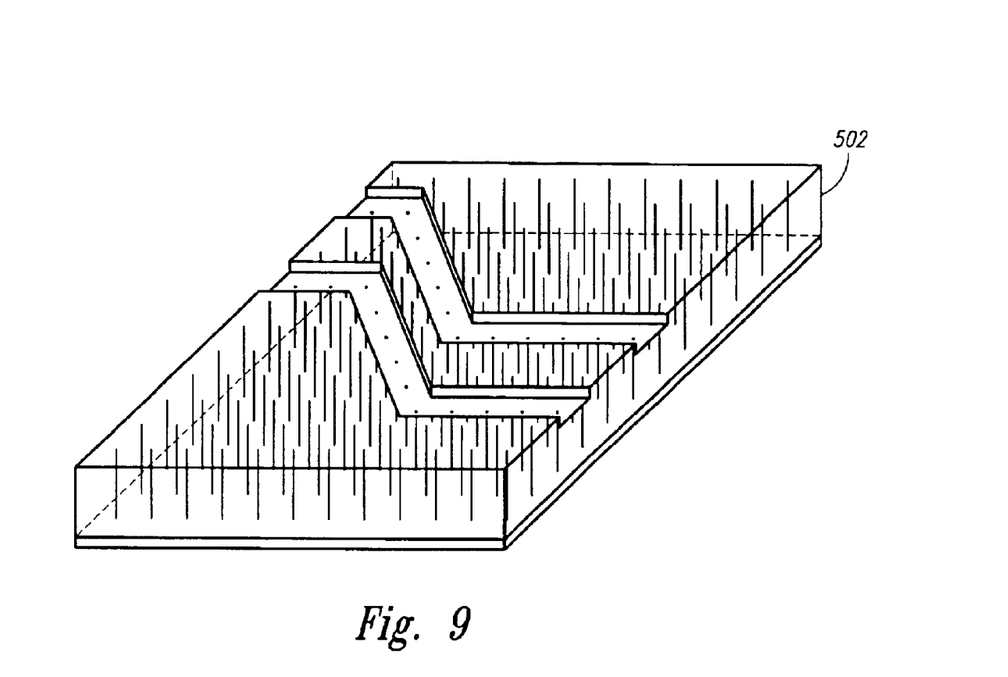
FIG. 9 illustrates an alternative, second method for manufacturing filament-suspended traces.

FIG. 9 illustrates an alternative method for manufacturing filament-suspended traces. Starting from the initial material shown in FIG. 5, trenches have been inscribed on the surface of the filament-containing dielectric substrate 502 by a mechanical or photolithographic process. These trenches can then be filled by vapor deposition of a metallic element or alloy or by an electrolytic process and, if necessary, the surface of the substrate can then be planarized to produce the exposed coplanar traces shown in FIG. 8.

Figure 10:
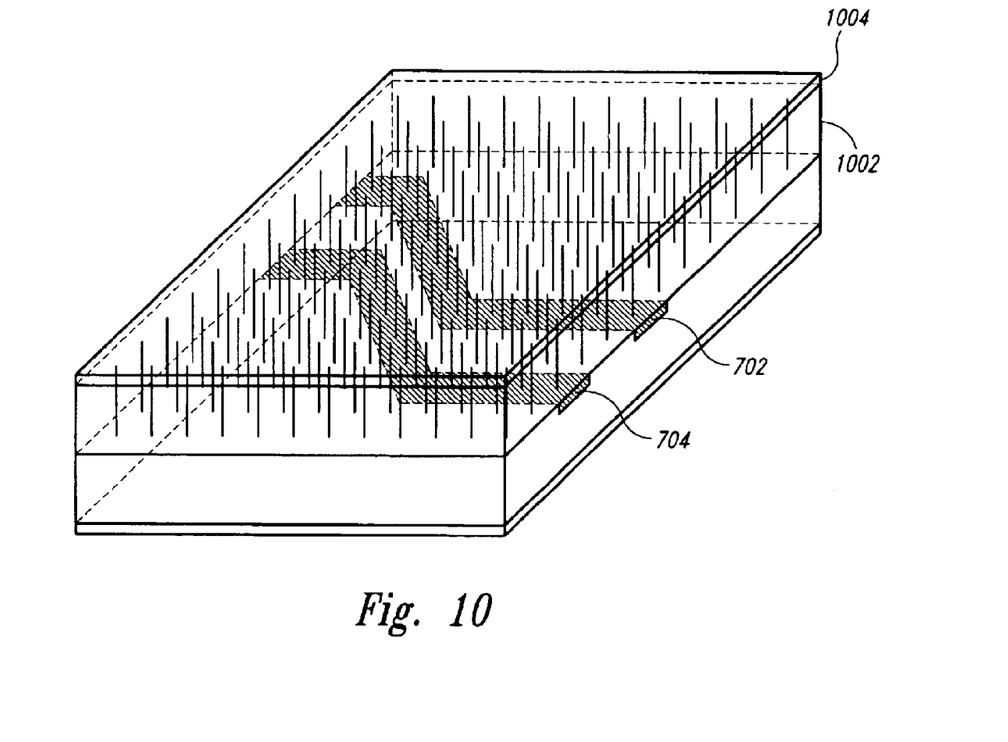
FIG. 10 shows a next step in manufacturing filament-suspended traces within circuit boards and microelectronic devices.

FIG. 10 shows a next step in manufacturing filament-suspended traces within a circuit board or microelectronic device. In FIG. 10, a second filament-containing dielectric substrate 1002 laminated to an overlying third conductive plane 1004 has been laminated or bonded to the trace-exposed material shown in FIG. 8. It is necessary for this bonding or laminating process to result in strong adhesion of exposed ends of filaments within the second filament-containing dielectric substrate 1002 to the surface of the traces 702 and 704. In certain embodiments, an adhesive or other filament-bonding medium may need to be applied to the surface of the traces in order to achieve effective filament/trace bonding. At this point, the bi-layered filament-containing dielectric substrate with embedded traces is structurally and physically similar to the portion of a standard circuit board or microelectronic device illustrated in FIG. 3. Thus, the circuit board or microelectronic device containing the bi-layered filament-containing dielectric substrate with embedded traces can be processed by standard manufacturing processes, including bonding to various subcomponents or additional dielectric substrate and conductive reference plane layers, and can be shaped and fashioned as needed by standard techniques. This includes connections to blind and buried vias and plated-through holes.

Figure 11:
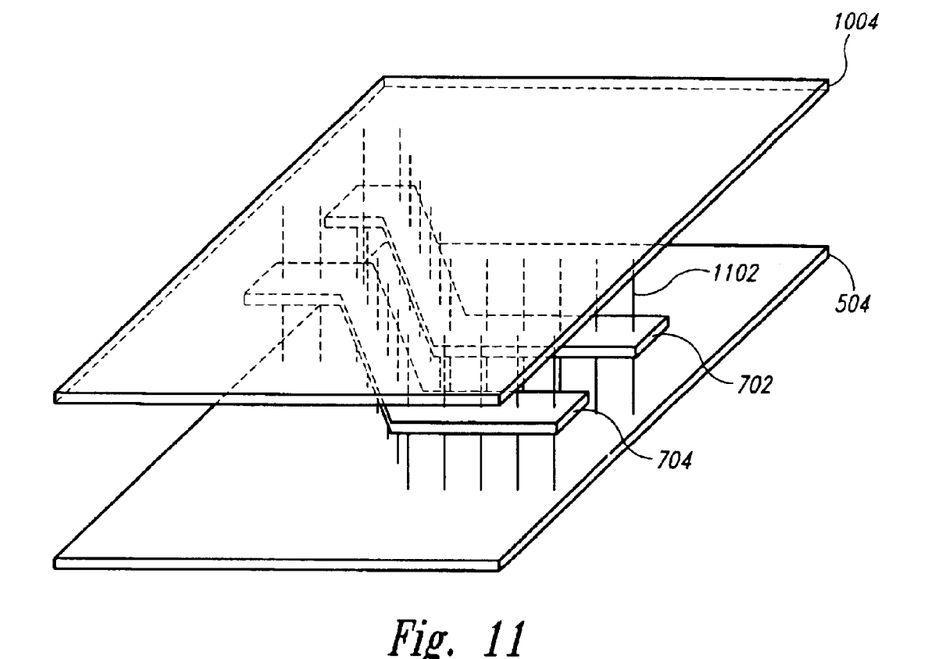
FIG. 11 illustrates a final step in the manufacture of filament-suspended traces within circuit boards and microelectronic devices.

FIG. 11 illustrates a final step in the manufacture of filament-suspended traces within a circuit board or microelectronic device. Once the circuit board or microelectronic device has been fabricated, the matrix of the filament-containing dielectric substrate is removed by any of the above-discussed methods, including melting, sublimation, chemical dissolution, or other such methods. Once the matrix is removed, the traces 702 and 704 remain suspended between the underlying 504 and overlying 1004 conductive reference planes by filaments, such as filament 1102. Note that, in FIG. 11, filaments not bonded to traces have been removed. However, those filaments may be left within the space between the conductive reference planes.

Figure 12:
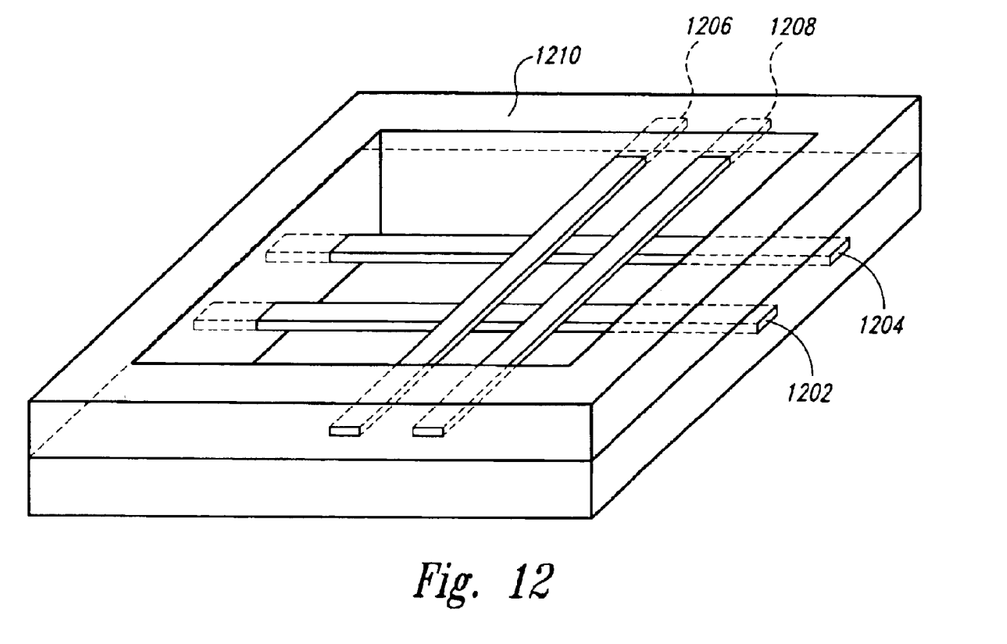
FIG. 12 illustrates a region within circuit boards and microelectronic devices including several layers of traces.

The manufacturing techniques illustrated in FIGS. 5–11 can be applied to produce large regions within circuit boards or microelectronic devices containing filament-suspended traces. These regions may contain multiple layers of traces. FIG. 12 illustrates a region within a circuit board or microelectronic device including several layers of traces. The filaments that suspend portions of the traces are not shown in FIG. 12, in the interest of clarity of illustration. In FIG. 12, two traces 1202 and 1204 underlie, and are orthogonal in plane projection to two overlying traces 1206 and 1208. The matrix material of the filament-containing dielectric substrate within a region near the point of overlap of the two sets of traces has been removed in a manufacturing process as illustrated in FIGS. 5–11. Surrounding this region is unremoved dielectric 1210, necessary for structural reasons or not requiring removal in order to achieve appropriate signal intensity attenuation thresholds. Thus, for example, matrix may be removed only from critical regions of a circuit board or microelectronic device in order to produce desired attenuation coefficients $\alpha_D$ for signal lines passing through the critical regions.

Although the present invention has been described in terms of a particular embodiment, it is not intended that the invention be limited to this embodiment. Modifications within the spirit of the invention will be apparent to those skilled in the art. For example, many different types of filament-containing dielectric substrates may be used to practice the present invention, differing in filament orientation, density, and chemical composition of both filament and matrix portions of the composite material. Filament-suspended traces maybe employed in a wide variety of different types of circuit boards and microelectronic devices. The traces may be suspended between any two or more surfaces within a circuit board or microelectronic device, and, when sufficiently stiff filaments are used, may be elevated above a single surface by a single set of filaments supporting the trace above the surface, or holding the trace suspended below the surface. A wide variety of manufacturing processes may be employed to fabricate filament-suspended or filament-supported traces, in addition to the two methods described above. The traces may themselves be made from many different types of conductive material.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A method for fabricating a filament-affixed trace within an electronic device, the method comprising:
   providing a composite substrate containing filaments in a matrix bonded to an underlying solid material;
   affixing a conductive trace to an exposed surface of the composite substrate; and
   removing the matrix to leave the trace affixed by filaments to the underlying solid material.

2. The method of claim 1 wherein affixing a conductive trace to the exposed surface of the composite substrate further comprises:
   fabricating the trace onto the exposed surface of the composite substrate by a fabrication method selected from among fabrication methods including:
   vapor deposition;
   electrolytic deposition;
   photolithography and etching;
   cutting by a focused beam of electromagnetic radiation; and
   cutting by a focused beam of charged particles.

3. The method of claim 1 prior to affixing the conductive trace to the exposed surface of the composite substrate, the exposed surface of the composite substrate is planarized.

4. The method of claim 1 further including, after affixing the conductive trace to the exposed surface of the composite substrate:
   affixing a second composite substrate containing filaments in a matrix, bonded to an overlying solid material, to the exposed surface of the composite substrate to which the conductive trace is affixed, thereby embedding the conductive trace within a composite-substrate bi-layer comprising the composite substrate to which the conductive trace is affixed and the second composite substrate.

5. The method of claim 4 wherein, prior to affixing the second composite substrate containing filaments in a matrix, bonded to an overlying solid material, to the exposed surface of the composite substrate bonded to the underlying solid material, the surfaces of the composite substrates are planarized.

6. The method of claim 1 wherein removing the matrix to leave the trace affixed by filaments to the underlying solid material further comprises:
   heating the matrix above a matrix melting temperature and below a filament melting temperature.

7. The method of claim 1 wherein removing the matrix to leave the trace affixed by filaments to the underlying solid material further comprises:
   exposing the matrix to a solvent in which the matrix is soluble but the filaments are not soluble.

8. The method of claim 1 wherein removing the matrix to leave the trace affixed by filaments to the underlying solid material further comprises:
   exposing the matrix to a chemical solution that chemically dissolves the matrix but that does not dissolve the filaments.

9. The method of claim 1 wherein removing the matrix to leave the trace affixed by filaments to the underlying solid material further comprises:
   heating the matrix above a matrix sublimation temperature.

10. The method of claim 1 further including first analyzing the trace with respect to additional components of the electronic device, including other traces, to identify a critical region within which the trace that needs to be surrounded by a dielectric substrate with a low loss tangent, and removing the matrix from the critical region to leave the trace, within the critical region, affixed by filaments to the underlying solid material.

* * * * *

UNITED STATES PATENT AND TRADEMARK OFFICE
CERTIFICATE OF CORRECTION

PATENT NO. : 6,938,331 B2 Page 1 of 1
APPLICATION NO. : 10/703122
DATED : September 6, 2005
INVENTOR(S) : James J. deBlanc et al.

It is certified that error appears in the above-identified patent and that said Letters Patent is hereby corrected as shown below:

In column 2, line 43, delete "$\Delta\alpha$" and insert -- $\Delta a$ --, therefor.

In column 8, line 13, in Claim 3, delete "claim wherein 1" and insert -- claim 1 wherein, --, therefor.

Signed and Sealed this

Twenty-seventh Day of July, 2010

David J. Kappos
*Director of the United States Patent and Trademark Office*